(12) United States Patent
Olson et al.

(10) Patent No.: US 6,933,778 B2
(45) Date of Patent: Aug. 23, 2005

(54) METHOD AND APPARATUS FOR EFFICIENT MIXED SIGNAL PROCESSING IN A DIGITAL AMPLIFIER

(75) Inventors: Erlend Olson, Duarte, CA (US); Ion Opris, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/921,016

(22) Filed: Aug. 18, 2004

(65) Prior Publication Data

US 2005/0030093 A1 Feb. 10, 2005

Related U.S. Application Data

(63) Continuation of application No. 09/346,361, filed on Jul. 1, 1999, now Pat. No. 6,791,404.

(51) Int. Cl.$^7$ .............................. H03F 3/38; H03F 3/217
(52) U.S. Cl. ...................................... 330/10; 330/207 A
(58) Field of Search .............................. 330/10, 207 A, 330/251

(56) References Cited

U.S. PATENT DOCUMENTS

| | | |
|---|---|---|
| 4,349,754 A | 9/1982 | Bull |
| 5,077,539 A | 12/1991 | Howatt |
| 5,257,026 A | 10/1993 | Thompson et al. |
| 5,274,375 A | 12/1993 | Thompson |
| 5,327,137 A | 7/1994 | Scheerer et al. |
| 5,508,647 A | 4/1996 | Okamoto |
| 5,617,058 A | 4/1997 | Adrian et al. |
| 5,617,090 A | 4/1997 | Ma et al. |
| 5,701,106 A | 12/1997 | Pikkarainen et al. |
| 5,777,512 A | 7/1998 | Tripathi et al. |

(Continued)

FOREIGN PATENT DOCUMENTS

WO    WO 00/35082    6/2000

OTHER PUBLICATIONS

A. J. Magrath, et al., "Power Digital–to–Analogue Conversion Using a Sigma–Delta Modulator with Controlled Limit Cycles," *Electronics Letters*, Feb. 16, 1995, pp. 251–253, vol. 31, No. 4, IEE, Stevenage, Herts, GB. (XP000513671).

Norsworthy, S. R. ed. (1996). "Delta–Sigma Data Converters–Theory, Design, and Simulation," IEEE Press, pp. 152–155. 178–183.

*Primary Examiner*—Steven J. Mottola
(74) *Attorney, Agent, or Firm*—Christie, Parker & Hale, LLP

(57) ABSTRACT

A system and method of creating a highly efficient digital amplifier which can take either analog or digital inputs, and produce a high power accurate representation of the input to drive speakers or other low impedance load is described. The system employs a transition detector and delay unit which allows the comparator of the signal modulator to ignore its inputs for a pre-determined number of subsequent clock cycles once an output transition has been detected. Through the use of faster clocks and variable clock cycle skips upon the comparator's output transition, finer resolution of the feedback's clock period for noise-shaping purposes is achieved. Finer resolution of the clock period allows the present invention to employ a more aggressive noise-shaping than previously possible.

In another aspect of the invention; additional delta-sigma modulator noise suppression is obtained by using the common bridge implementation of the power output stage with the improvement of configuring the bridge to create a 3-state condition instead of the conventional 2 states. By controlling the two halves of the bridge independently of one another, an output with 3 states makes for improved noise shaping performance.

20 Claims, 8 Drawing Sheets

U.S. PATENT DOCUMENTS

| | | |
|---|---|---|
| 5,974,089 A | 10/1999 | Tripathi et al. |
| 6,097,249 A * | 8/2000 | Strickland et al. ............ 330/10 |
| 6,111,532 A | 8/2000 | Hirano et al. |
| 6,137,429 A | 10/2000 | Chan et al. |
| 6,151,613 A | 11/2000 | Khoini-Poorfard |
| 6,215,423 B1 | 4/2001 | May et al. |
| 6,362,763 B1 | 3/2002 | Wang |
| 6,414,613 B1 | 7/2002 | Midya et al. |
| 6,587,060 B1 | 7/2003 | Abbey |

* cited by examiner

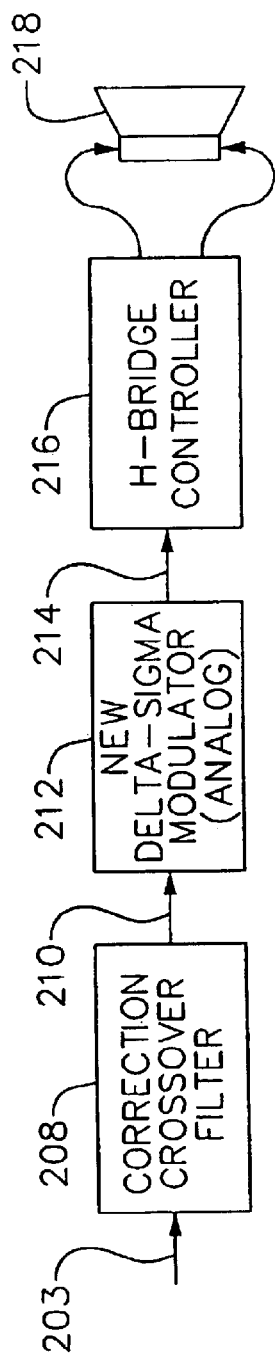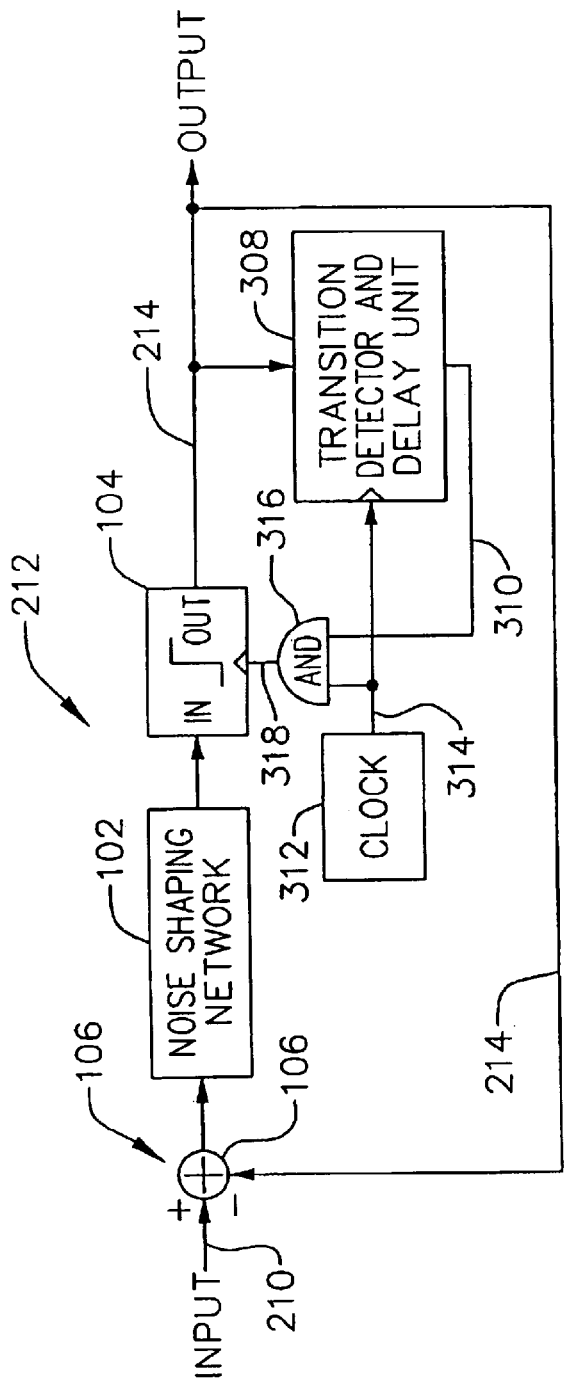

US 6,933,778 B2

METHOD AND APPARATUS FOR EFFICIENT MIXED SIGNAL PROCESSING IN A DIGITAL AMPLIFIER

CROSS-REFERENCE TO RELATED APPLICATION(S)

This application is a continuation of U.S. patent application Ser. No. 09/346,361, filed Jul. 1, 1999, now U.S. Pat. No. 6,791,404, issued Sep. 14, 2004, the contents of which are hereby incorporated by reference.

BACKGROUND OF THE INVENTION

1. Field of the Invention

The present invention relates to the field of switching amplifiers. More specifically, the present invention relates to a novel method of sampling in the signal modulation stage of a digital amplifier to achieve a highly accurate representation of the input signal at substantial gain.

2. Description of the Related Art

There have been various developments pertaining to oversampled, noise-shaping signal processing. These developments have been applicable to both continuous-time (analog) and discrete-time (digital or sampled analog) signals. The constant struggle in this field is to increase the efficiency of the amplifiers. Given the myriad of applications of sound applications in the electronics of today, it is apparent that an efficient audio amplification is highly desirable.

In response to this need, attempts have been made to design switching audio amplifiers using oversampled, noise-shaping modulators, especially delta-sigma modulators. A prior art first order delta-sigma modulator is shown in FIG. 1. A noise shaping network 102 is connected in series with a comparator 104, which is a 1-bit quantizer with sampling rate $f_s$. The output 105 of the comparator is fed back to the noise shaping network via summation element 106. The feedback in turn forces the average value of the quantized output signal to track the average value of the input to the modulator 100. Any difference between the quantized output and modulator input is accumulated in the noise shaping network 102 and eventually corrected. For first-order delta-sigma modulators, noise in the signal band due to quantization error is reduced by approximately 9 dB for each doubling of the oversampling ratio (OSR). The OSR is given by $f_s/2f_o$, where $2f_o$ is the Nyquist rate, i.e., twice the bandwidth $f_o$ of the baseband signal, and $f_s$ is the previously mentioned 1-bit quantizer's sampling rate. For second-order delta-sigma modulators, this noise is reduced by approximately 15 dB (9 dB+6 dB) for the same increase in OSR. However, noise improvements achieved by increases in the OSR, i.e., increases in $f_s$, are ultimately limited as the rise and fall times of the output signal become significant with respect to the sample period.

Accordingly, it would be highly desirable to employ aggressive noise shaping while at the same time maintaining a fixed signal feedback rate for improved noise shaping. This would allow efficient application of audio amplification in many of today's electronics such as multimedia computers.

SUMMARY OF THE INVENTION

A system and method of creating a highly efficient digital amplifier which can take either analog or digital inputs, and produce a high power accurate representation of the input to drive speakers or other low impedance load is described. The system employs a transition detector and delay unit which allows the comparator of the signal modulator to ignore its inputs for a pre-determined number of subsequent clock cycles once an output transition has been detected. Through the use of faster clocks and variable clock cycle skips upon the comparator's output transition, finer resolution of the feedback's clock period for noise-shaping purposes is achieved. Finer resolution of the clock period allows the present invention to employ a more aggressive noise-shaping than previously possible.

In another aspect of the invention, additional delta-sigma modulator noise suppression is obtained by using the common bridge implementation of the power output stage with the improvement of configuring the bridge to create a 3-state condition instead of the conventional 2 states. By controlling the two halves of the bridge independently of one another, an output with 3 states makes for improved noise shaping performance.

BRIEF DESCRIPTION OF THE DRAWINGS

FIG. 2B is a schematic representation of one embodiment of a digital amplifier that incorporates the present invention for processing analog inputs;

FIG. 3 is a schematic representation of the new implementation of a sigma-delta modulator in accordance with the present invention;

DETAILED DESCRIPTION OF THE PREFERRED EMBODIMENT

The present description is of the best presently contemplated mode of carrying out the invention. This description is made for the purpose of illustrating the general principles of the invention and should not to be taken in a limiting sense. The scope of the invention is best determined by reference to the appended claims.

Figure 2A:
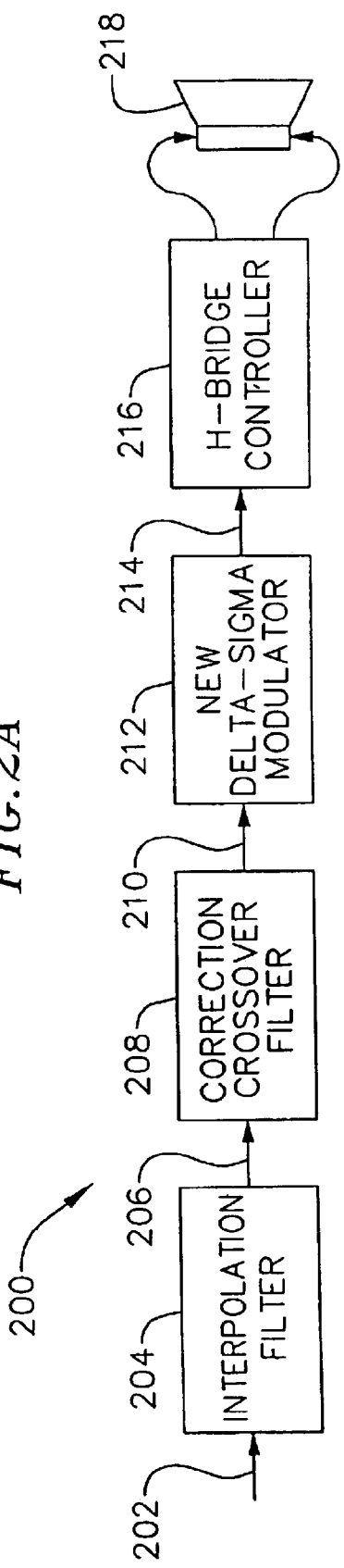
FIG. 2A is a schematic representation of one embodiment of a digital amplifier which incorporates the present invention for processing digital inputs.

The present invention will be described in reference to a 1-bit digital amplifier 200. Referring to FIG. 2A, the input may be a digital signal 202 consisting of typically a 16 bit or 18 bit digital input. In this example, it may be a digital audio input at 48 kHz. A digital interpolation filter 204, converts the low rate, multi-bit signal 202 to a high rate multi-bit signal 206. The signal 206 consists of typically 16 to 22 bits in an audio application at a sample rate of typically 32 to 128 times the original sample rate at 202. An additional digital filter 208 can also be added, which performs two functions. First, it performs a typical crossover function commonly used in audio to divide up the frequency content of the incoming signal 202, in order to more carefully parameterize for proper reproduction of signals through the subsequent signal path. Second, it performs a pre-warping of the signal frequency content such that after the signal 210 is subsequently warped through the non-linear mechanical response of the speaker 218, the resulting audio has flat frequency response to the listener. The signal 210 then enters the new type of delta-sigma modulator 212. This new type of modulator, further described below, then outputs a signal 214 which possess certain special characteristics also further described below. Finally, the signal at 214 then drive a typical H-bridge controller 216, which directly drives the speakers 218.

Referring to FIG. 2B, the core of the 1-bit digital amplifier, consisting of the delta-sigma modulator 212 and the H bridge controller 216, can also be used in an embodiment that receives an analog signal 203, instead of a digital signal 202. For the analog input signal 203, an interpolation filter is not required.

Figure 1:
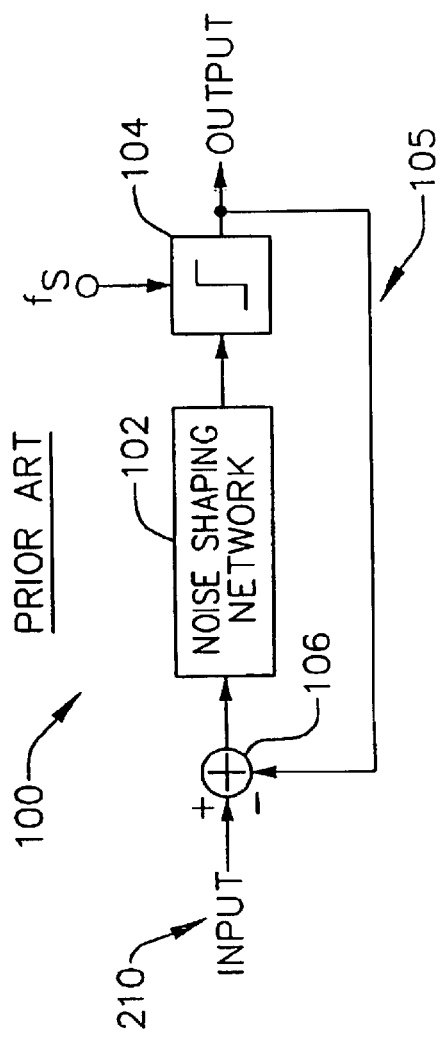
FIG. 1 is a schematic representation of a prior art first order delta-sigma modulator.
Figure 4:
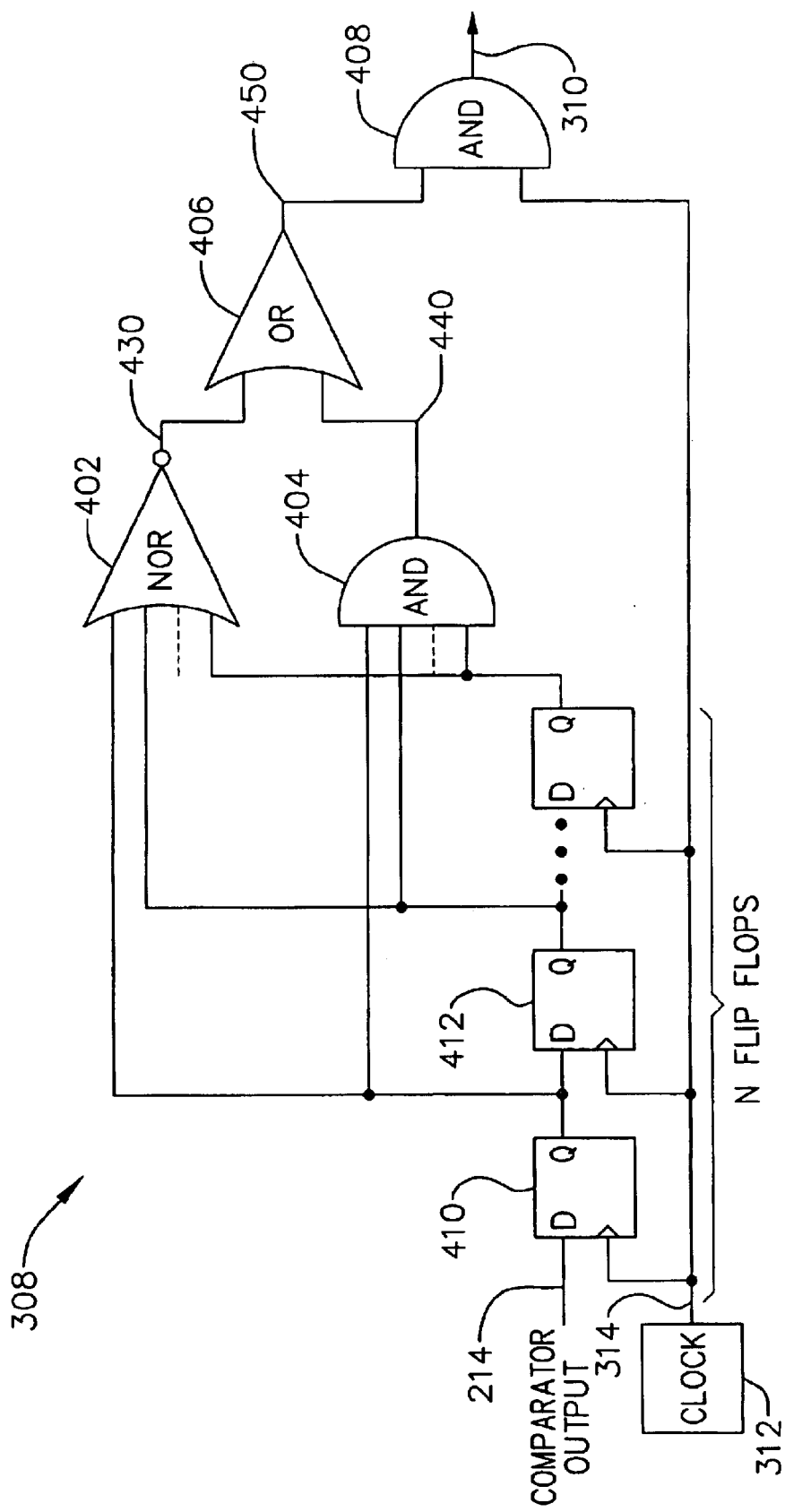
FIG. 4 is a schematic representation of an embodiment of the transition detector and delay unit of FIG. 3.

Referring to FIG. 3, delta-sigma modulator 212 of FIG. 2 is shown in further detail. The configuration may be applied to any single loop 1-bit feedback delta-sigma modulator as indicated in FIG. 1. In FIG. 3, output 214 of the comparator 104 is fed back to the noise shaping network along with input 210 via summation element 106. The noise shaping network 102 is coupled to the comparator 104 which is then coupled to the transition detector and delay unit 308. The output 310 of the transition detector and delay unit 308 provides the inputs of the AND gate 316. The output 318 of the AND gate 316 provides the clock input of the comparator 104. This clock input 318 determines the moment when the comparator output 214 gets updated. The transition detector and delay unit 308 allows the comparator 104 to ignore its inputs for a pre-determined number of subsequent clock cycles once an output transition has been detected. In other words, when the comparator output 214 goes through a transition (e.g., from 0 to 1 or from 1 to 0), the output 310 from the transition detector and delay unit 308 is always a "0" to disable the comparator 104. The comparator 104 in such an instance is disabled since the output 318 of the AND gate 316 will always be a "0" if at least one of its inputs is a "0". A possible implementation of the transition detector and delay unit 308 is shown in FIG. 4. In this implementation, N flip-flops 410, 412, and so forth are employed to provide an output 310 such that inputs to the comparator 104 will be ignored for a period of N clock cycles following a transition in the comparator output 214. Thus, N is a variable value which may be adjusted to achieve specified results. As illustrated in FIG. 4, the transition detector and delay unit 308 employs a NOR gate 402 and an AND gate 404. Basically, the OR gate 406 will provide output 450 of "1" if either output 430 from the NOR gate 402 or the output 440 from the AND gate 404 is a "1". The only way for a NOR gate to produce an output of "1" is to have all its inputs be "0". The only way for an AND gate to produce an output of "1" is to have all its inputs be "1". Therefore, it is clear that any combination of "0" and "1" as the inputs for either the NOR gate 402 or AND gate 404 will result in each respective output to be "0". This configuration allows the comparator 104 to effectively ignore its inputs 210 for a pre-determined number of clock cycles once its output 214 has gone through a transition.

The end result of this arrangement is that the comparator output 214, and therefore the drive signal 214 for the H-bridge controller 216, cannot change states faster than the clock frequency of the delta-sigma modulator divided by N, which is significantly lower than the clock frequency. Since the feedback 214 in the 1-bit delta sigma modulator (FIG. 1) is basically disabled during the non-responsive period (N clock cycles) of the comparator 104, the stability of the loop is affected. Therefore, the noise shaping afforded by the delta-sigma converter has to be less aggressive than that typically cited in such designs where the feedback is expected to be responsive at the clock frequency. However, this is assuming that the clock frequency of the modulator remains the same. If a faster clock is employed to offset the increasing value of N, then the comparator response and hence the feedback signal is a feedback at the frequency of the faster clock divided by N, but with a finer resolution of the clock period, since the "high" or "low" output of the comparator can exist for N clocks, N+1 clocks, N+2 clocks, and so on.

For example, assume that for N=1, a clock with a frequency of 1 MHz (period of 1 $\mu$s) is used in the modulator. So, with N=1, there is no delay caused by the transition in comparator output and the feedback occurs at a frequency of 1 MHz. Now, assume that for N=10, a clock with a frequency of 10 MHz (period of 1/10 $\mu$s) is used in the modulator. Then, every transition of the comparator output causes the comparator to ignore its inputs for 10 clock cycles. However, since the faster clock has a frequency of 10 MHz, the feedback frequency is still 1 MHz (10 MHz divided by N=10). With the feedback frequency remaining the same by using a faster clock, this invention maintains the desired feedback frequency rate while at the same time achieving finer resolution of the clock period of 1/10 $\mu$s. Finer resolution of the clock period allows the present invention to employ a more aggressive noise-shaping than previously possible. A complete theory of delta-sigma modulator basic design can be found in "Delta-Sigma Data Converters—Theory, Design and Simulation" edited by S. R. Norsworthy, R. Schreier and G. Temes, IEEE Press, 1996 pp. 152–155 and pp. 178–183.

A noise shaping function that maintains stability with the approach described herein can be obtained by adjusting the coefficients of a standard noise shaping function. Unfortunately, since sigma-delta converters are based on the non-linear function of the 1-bit quantizer (the comparator), there is no general linear stability theory currently in existence for loop orders higher than two, but the stability of the loop can only be verified through simulations.

Figure 5:
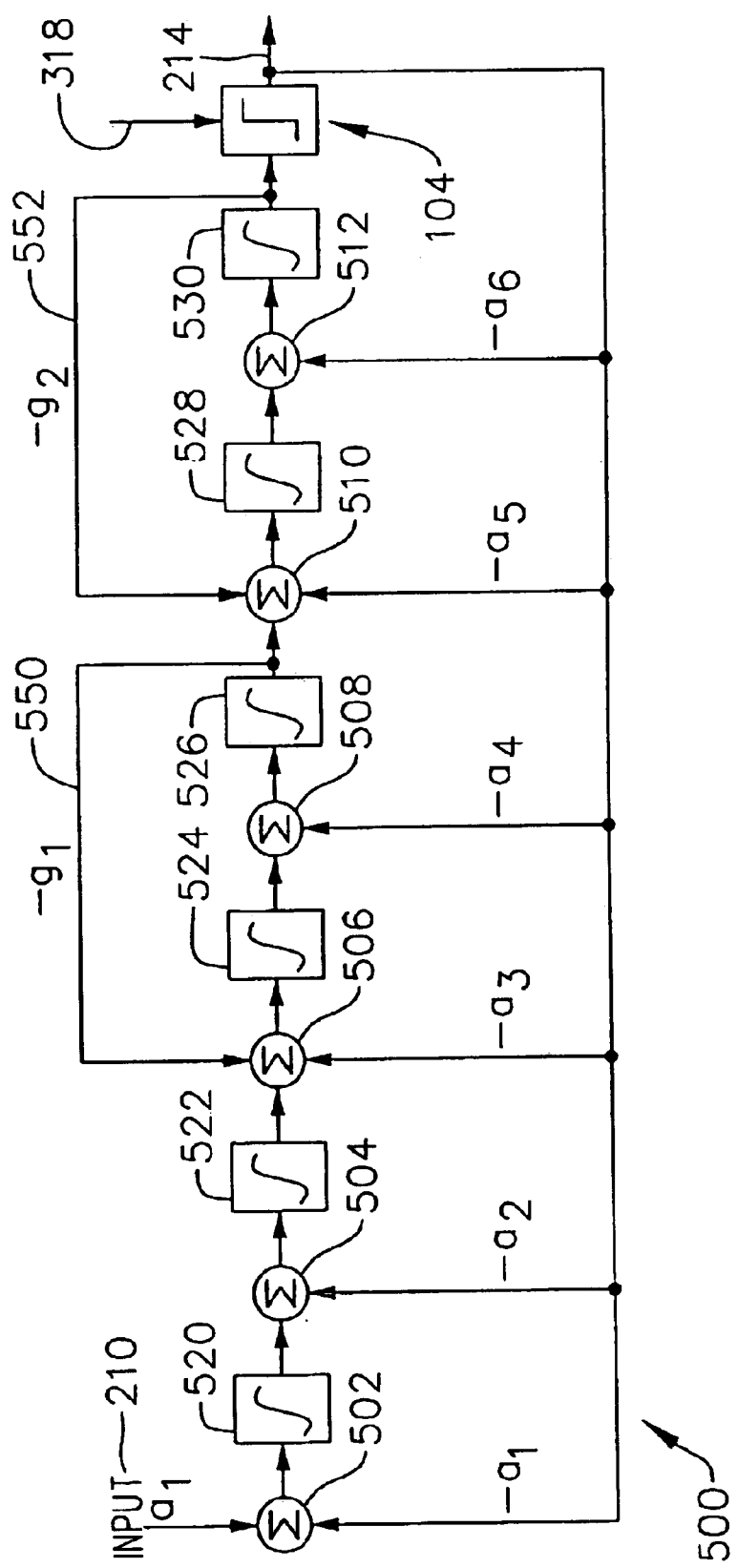
FIG. 5 is a schematic representation of a single-loop 1-bit feedback $6^{th}$ order sigma-delta modulator which incorporates the present invention.
Figure 6:
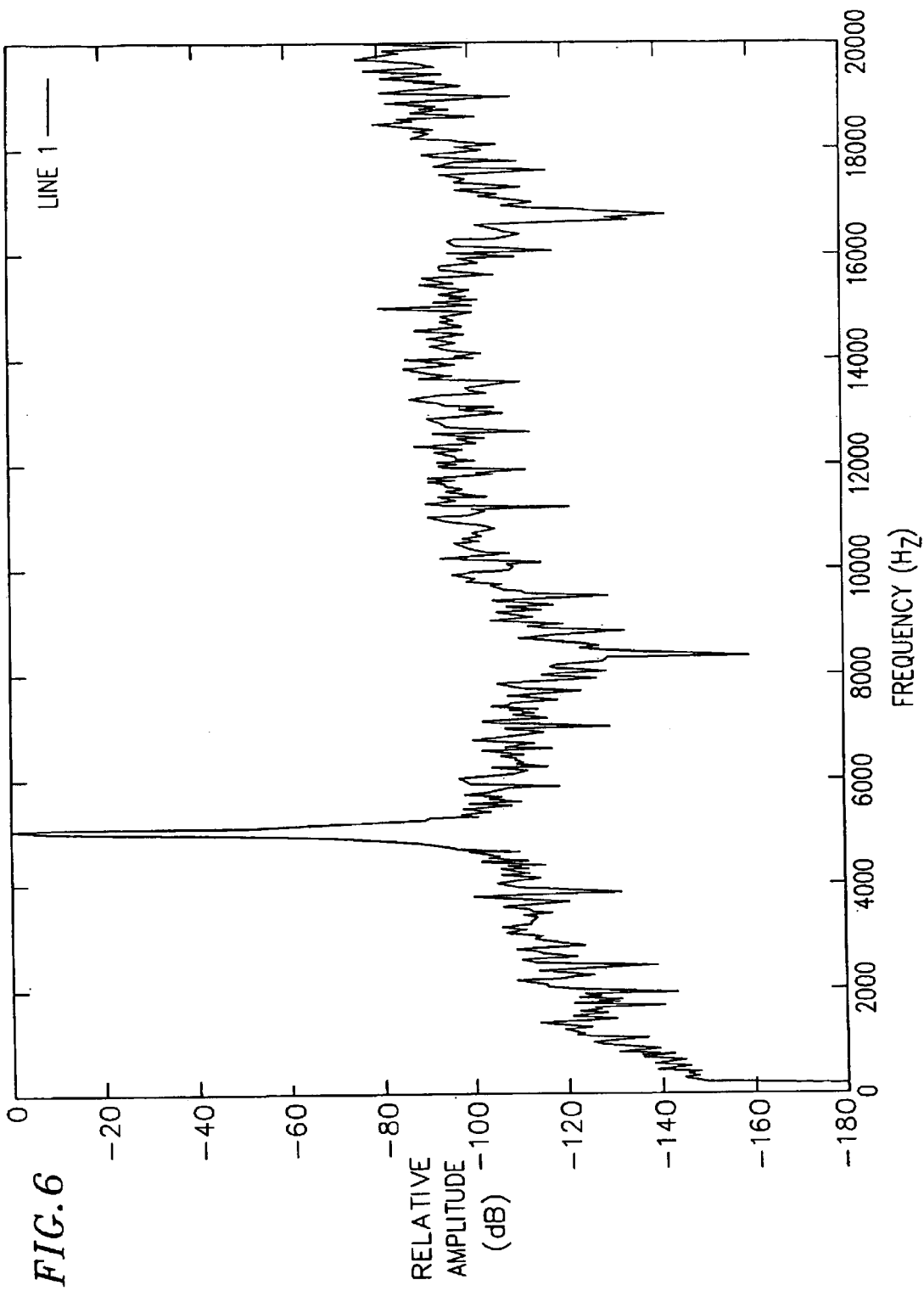
FIG. 6 is a graph of the signal spectrum for a conventional $6^{th}$ order delta-sigma modulator with $F_{clock}=1$ MHZ.
Figure 7:
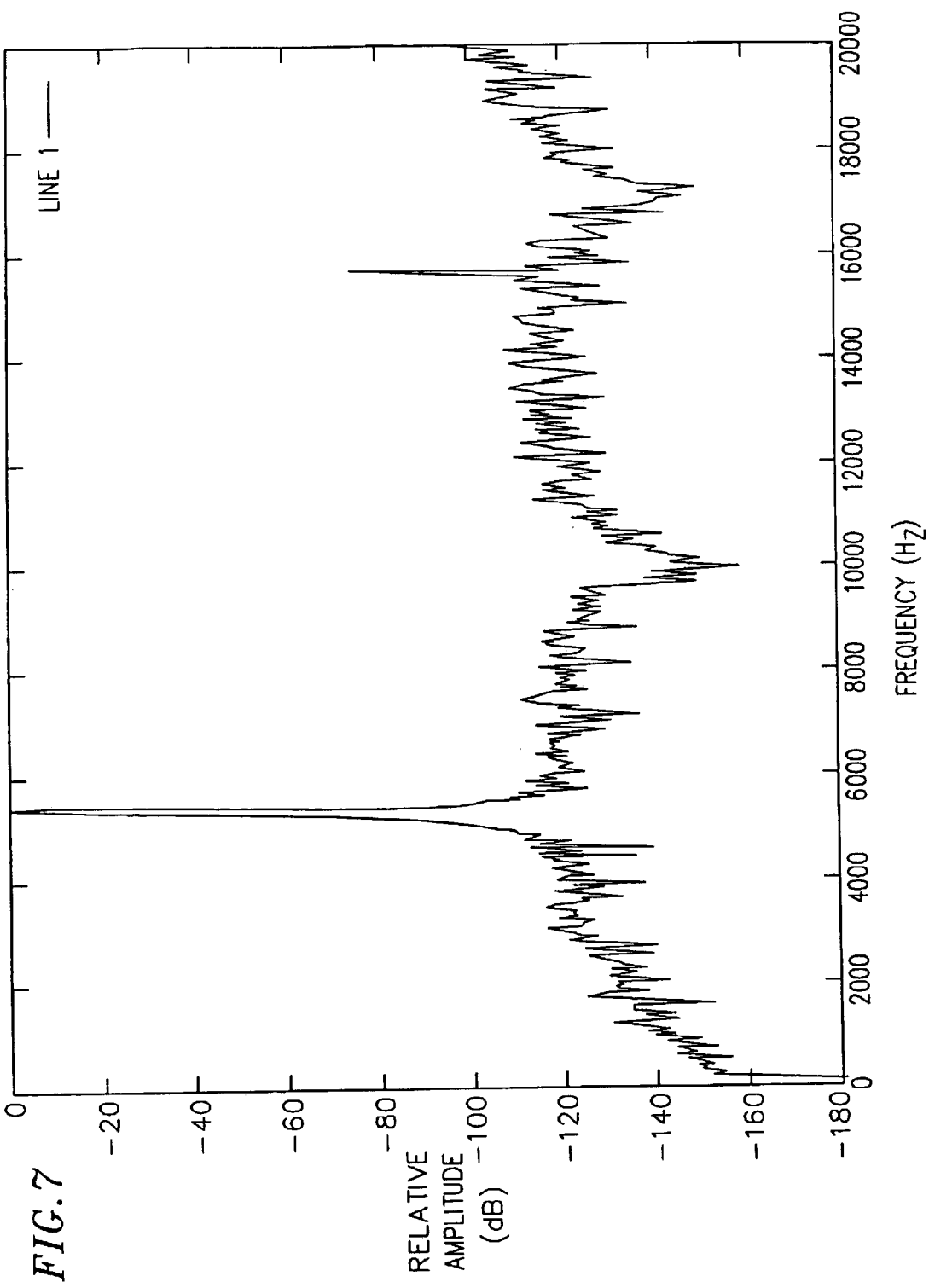
FIG. 7 is a graph of the signal spectrum for a $6^{th}$ order delta-sigma modulator with $F_{clock}=10$ MHZ and N=10 according to an embodiment of the present invention.

A digital amplifier involving a conventional single-loop 1-bit feedback 6th order delta-sigma modulator 500 is shown in FIG. 5. Referring to FIG. 5, there are six summation elements 502, 504, 506, 508, 510, 512 coupled in series to six integrators 520, 522, 524, 526, 528, 530. The input 210 is fed into the system via summation element 502 and is eventually fed as the input to the comparator 104. The output 214 of the comparator 104 is fed back to each of the six summation elements of the modulator 500. An example of the output of such a digital amplifier with Fclock=1 MHz which achieves 69 dB signal-to-noise ratio (SNR) in a 20 kHz BW, is shown in FIG. 6. It has an output clock, and hence comparator resolution and power device switching time of 1 $\mu$s. By using a 10 MHz clock instead with N=10 (again then, the minimum comparator resolution is 1 $\mu$s), in accordance with one embodiment of the present invention, the SNR in the same 20 kHz band is 90 dB, as indicated by the signal-to-noise ratio (SNR) in FIG. 7. The feedback coefficients for this particular example are:

a6=6(1-a)
a5=15(1-a)$^2$
a4=20(1-a)$^3$
a3=15(1-a)$^4$
a2=6(1-a)$^5$
g1=1.2E-4
g2=4.0E-5 where a is a parameter close to 1 used for stability simulations (a=0.98 in this example), and g1 and g2 are resonator settings, as indicated in FIG. 5. As previously mentioned, the method is equally applicable to analog or digital implementations.

Figure 8:
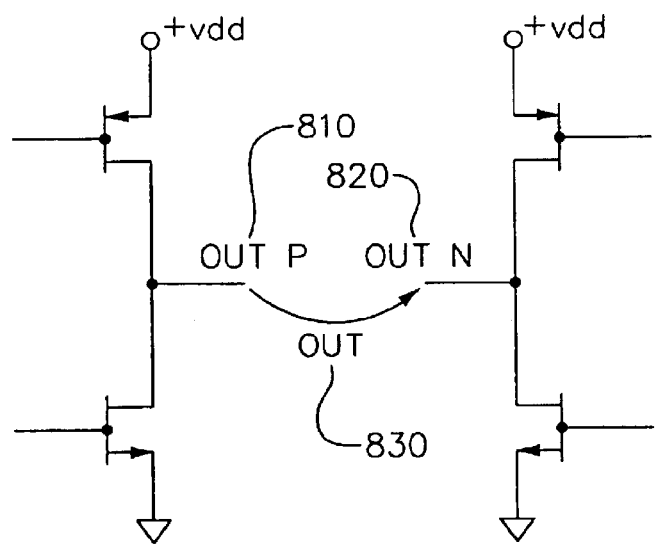
FIG. 8 is a schematic representation of bridge output as existing in the prior art.
Figure 9:
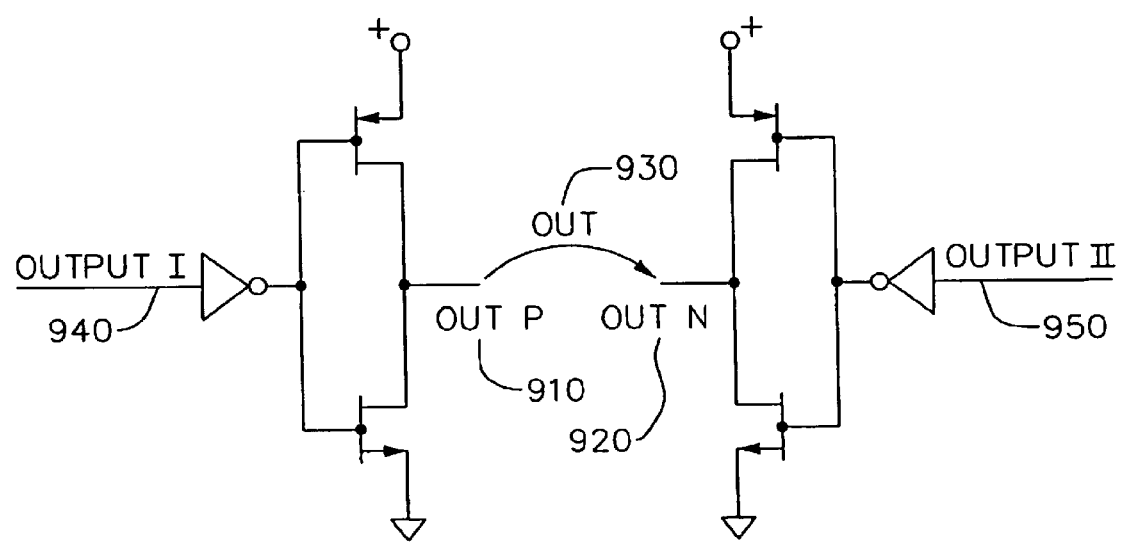
FIG. 9 is a schematic representation of bridge circuit in accordance with one embodiment of the present invention.
Figure 10:
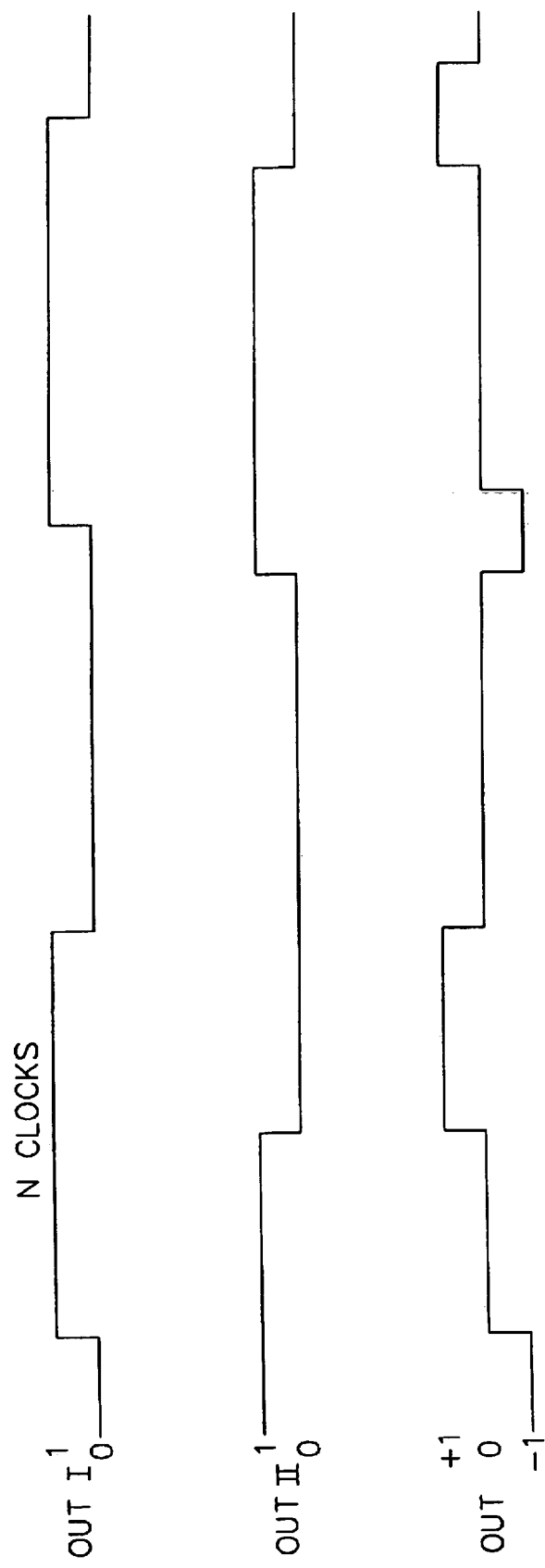
FIG. 10 is an output diagram of the bridge circuit in FIG. 9.

In another aspect of the invention, a novel technique employed in the H-bridge controller 216 of FIG. 2 is disclosed. It relates to the technique previously described for the delta-sigma converter. Referring to the prior art as shown in FIG. 8, the bridge Output P 810 and Output N 820 are dependent on one another. In other words, Output P 810 and Output N 820 are both $-V_{dd}$ or $+V_{dd}$. Thus, with the Output 830=Output P 810–Output N 820, the peak-to-peak maximum amplitude is $2V_{dd}$ (either $+2V_{dd}$ or $-2V_{dd}$). Additional delta-sigma modulator noise suppression can be obtained by using the common bridge implementation of the power output stage shown in FIG. 9, with the improvement of configuring the bridge to create a 3-state condition instead of the conventional 2 states. By controlling the two halves of the bridge independently of one another, Output P 910 and Output N 920 have values independent from one another. Thus, four different possible permutations exist for values of Output I 940 and Output II 950. The combination of these four values determine the three states of Output 930 value, since Output=Output I–Output II. The Output 930 thus has three states as shown in FIG. 10. The delta-sigma modulator feedback can then also be interpreted as 3 states instead of only 2, and the noise-shaping performance of the loop is improved by an additional 3 dB. By adding the third state to the feedback the stability of the loop is improved and the noise shaping function can be designed more aggressively. Moreover, the gating mechanism for the two legs can be independent, so output changes faster than $T_{clock}*N$ can occur at the output without any device in the H-bridge switching faster than $F_{clock}/N$. This result can be seen in FIG. 10, where the period of Output I and Output II at any given state (0 or 1) span at least as long as $T_{clock}*N$. However, because Output is equal to the value of Output I–Output II (a combination of two independent results), the period of Output's state (–1, 0, or 1) can be shorter than $T_{clock}*N$. Therefore, the state transition of Output may occur at a rate faster than $F_{clock}/N$.

What is claimed is:

1. A digital amplifier, comprising:
a summation circuit coupled to receive an input signal and a feedback signal and to generate a summed output signal from the input signal and the feedback signal;
a noise shaping network coupled to receive the summed output signal from the summation circuit and to generate a noise shaped signal from the summed output signal;
a sampling stage coupled to receive the noise shaped signal from the noise shaping network and to generate a sampled signal from the noise shaped signal, the sampling stage having a predetermined sampling frequency and generating the sampled signal at an output frequency that differs from the sampling frequency;
a feedback loop coupled to receive the sampled signal at the output frequency from the sampling stage and to provide the feedback signal at the output frequency based on the sampled signal to the summation circuit; and
an output stage coupled to receive the sampled signal at the output frequency from the sampling stage and to generate an output signal at the output frequency based on the sampled signal, wherein the sampling stage further comprises a logic circuit for suppressing sampling of the noise shaped signal for a predetermined period, wherein the logic circuit further includes a transition detector for detecting a transition in the sampled signal, and wherein the predetermined period starts at the transition.

2. The digital amplifier of claim 1, wherein the output frequency is lower than the sampling frequency of the sampling stage by a predetermined multiple.

3. The digital amplifier of claim 1, wherein the sampling stage further comprises a logic circuit for suppressing sampling of the noise shaped signal for a predetermined period corresponding to the predetermined multiple.

4. The digital amplifier of claim 1, wherein the output stage includes an H-bridge controller.

5. The digital amplifier of claim 4, wherein the H-bridge controller takes a signal with two possible states and generates a bridge output with three possible states.

6. The digital amplifier of claim 4, wherein the H-bridge controller comprises two corresponding halves and wherein the two halves are controlled independent of one another.

7. The digital amplifier of claim 4, wherein the H-bridge controller comprises two corresponding halves and wherein the two halves produce outputs having values independent from one another.

8. The digital amplifier of claim 4, wherein the H-bridge controller comprises two corresponding halves, a first one of the two corresponding halves comprising a first inverter and a second one of the two corresponding haves comprising a second inverter.

9. The digital amplifier of claim 8, wherein the first one of the two corresponding halves receives a first signal through the first inverter and the second one of the two corresponding haves receives a second signal through the second inverter.

10. The digital amplifier of claim 9, wherein the two corresponding halves of the H-bridge controller combine the first signal received through the first inverter and the second signal received through the second inverter to generate a bridge output with three possible states.

11. The digital amplifier of claim 1, wherein the noise shaping network comprises a plurality of integrator stages.

12. A digital amplifier, comprising:
a summation circuit coupled to receive an input signal and a feedback signal and to generate a summed output signal from the input signal and the feedback signal;
a noise shaping network coupled to receive the summed output signal from the summation circuit and to generate a noise shaped signal from the summed output signal;
a sampling stage coupled to receive the noise shaped signal from the noise shaping network and to generate a sampled signal from the noise shaped signal, the sampling stage having a predetermined sampling frequency and generating the sampled signal at an output frequency that differs from the sampling frequency;
a feedback loop coupled to receive the sampled signal at the output frequency from the sampling stage and to provide the feedback signal at the output frequency based on the sampled signal to the summation circuit; and
an H-bridge controller coupled to receive the sampled signal from the sampling stage and to generate an output signal, wherein the H-bridge controller comprises two corresponding halves and wherein the two halves are controlled independent of one another.

13. The digital amplifier of claim 12, wherein the sampled signal received by the H-bridge controller has two possible states.

14. A digital amplifier, comprising:
a summation circuit coupled to receive an input signal and a feedback signal and to generate a summed output signal from the input signal and the feedback signal;
a noise shaping network coupled to receive the summed output signal from the summation circuit and to generate a noise shaped signal from the summed output signal;
a sampling stage coupled to receive the noise shaped signal from the noise shaping network and to generate a sampled signal from the noise shaped signal, the sampling stage having a predetermined sampling frequency and generating the sampled signal at an output frequency that differs from the sampling frequency;
a feedback loop coupled to receive the sampled signal at the output frequency from the sampling stage and to provide the feedback signal at the output frequency based on the sampled signal to the summation circuit; and
an H-bridge controller coupled to receive the sampled signal from the sampling stage and to generate an output signal, wherein the H-bridge controller comprises two corresponding halves and wherein the two halves produce outputs having values independent from one another.

15. A digital amplifier, comprising:
a summation circuit coupled to receive an input signal and a feedback signal and to generate a summed output signal from the input signal and the feedback signal;
a noise shaping network coupled to receive the summed output signal from the summation circuit and to generate a noise shaped signal from the summed output signal;
a sampling stage coupled to receive the noise shaped signal from the noise shaping network and to generate a sampled signal from the noise shaped signal, the sampling stage having a predetermined sampling frequency and generating the sampled signal at an output frequency that differs from the sampling frequency;
a feedback loop coupled to receive the sampled signal at the output frequency from the sampling stage and to provide the feedback signal at the output frequency based on the sampled signal to the summation circuit; and
an H-bridge controller coupled to receive the sampled signal from the sampling stage and to generate an output signal, wherein the H-bridge controller comprises two corresponding halves, a first one of the two corresponding halves comprising a first inverter and a second one of the two corresponding haves comprising a second inverter.

16. The digital amplifier of claim 15, wherein the first one of the two corresponding halves receives a first signal through the first inverter and the second one of the two corresponding haves receives a second signal through the second inverter.

17. The digital amplifier of claim 16, wherein the two corresponding halves of the H-bridge controller combine the first signal received through the first inverter and the second signal received through the second inverter to generate a bridge output with the three possible states.

18. The digital amplifier of claim 12, wherein the output signal has three possible states.

19. The digital amplifier of claim 14, wherein the signal has three possible states.

20. The digital amplifier of claim 5, wherein the signal has three possible states.

* * * * *

UNITED STATES PATENT AND TRADEMARK OFFICE
CERTIFICATE OF CORRECTION

PATENT NO. : 6,933,778 B2
DATED : August 23, 2005
INVENTOR(S) : Olson et al.

It is certified that error appears in the above-identified patent and that said Letters Patent is hereby corrected as shown below:

Title page,
Item [57], ABSTRACT,
Line 1, 2nd paragraph, after "invention" delete ";", insert -- , --.

Column 8,
Line 31, after "wherein the", insert -- output --.
Line 33, delete "claim 5, wherein the signal", insert -- claim 15, wherein the output signal --.

Signed and Sealed this

Thirty-first Day of January, 2006

JON W. DUDAS
*Director of the United States Patent and Trademark Office*